United States Patent
Shetty et al.

(10) Patent No.: US 12,084,790 B2
(45) Date of Patent: Sep. 10, 2024

(54) LOW ETCH PIT DENSITY 6 INCH SEMI-INSULATING GALLIUM ARSENIDE WAFERS

(71) Applicant: AXT, Inc., Fremont, CA (US)

(72) Inventors: Rajaram Shetty, Niskayuna, NY (US); Weiguo Liu, San Leandro, CA (US); Morris Young, Fremont, CA (US)

(73) Assignee: AXT, Inc., Fremont, CA (US)

( * ) Notice: Subject to any disclaimer, the term of this patent is extended or adjusted under 35 U.S.C. 154(b) by 0 days.

(21) Appl. No.: 18/337,493

(22) Filed: Jun. 20, 2023

(65) Prior Publication Data

US 2023/0407522 A1 Dec. 21, 2023

Related U.S. Application Data

(63) Continuation of application No. 16/711,019, filed on Dec. 11, 2019, now Pat. No. 11,680,340.

(60) Provisional application No. 62/779,039, filed on Dec. 13, 2018.

(51) Int. Cl.
| | |
|---|---|
| *C30B 29/42* | (2006.01) |
| *C30B 11/00* | (2006.01) |
| *H01L 29/20* | (2006.01) |
| *H01L 29/32* | (2006.01) |
| *H01L 29/36* | (2006.01) |
| *H01L 29/30* | (2006.01) |
| *H01S 5/30* | (2006.01) |

(52) U.S. Cl.
CPC ........... *C30B 29/42* (2013.01); *C30B 11/002* (2013.01); *C30B 11/006* (2013.01); *H01L 29/20* (2013.01); *H01L 29/32* (2013.01); *H01L 29/36* (2013.01); *H01L 29/30* (2013.01); *H01S 5/3013* (2013.01)

(58) Field of Classification Search
CPC ..... C30B 29/42; C30B 11/002; C30B 11/006; C30B 27/00; C30B 11/00; H01L 29/20; H01L 29/32; H01L 29/36; H01L 21/18; H01L 29/30; H01S 5/3013
See application file for complete search history.

(56) References Cited

U.S. PATENT DOCUMENTS

| | | | | |
|---|---|---|---|---|
| 7,566,641 B2 * | 7/2009 | Liu | ...................... | H01L 21/3228 438/478 |
| 2009/0249994 A1 * | 10/2009 | Liu | ...................... | C30B 11/002 117/214 |

* cited by examiner

*Primary Examiner* — Syed I Gheyas
(74) *Attorney, Agent, or Firm* — McAndrews, Held & Malloy, Ltd.

(57) ABSTRACT

Methods and systems for low etch pit density 6 inch semi-insulating gallium arsenide wafers may include a semi-insulating gallium arsenide single crystal wafer having a diameter of 6 inches or greater without intentional dopants for reducing dislocation density, an etch pit density of less than 1000 $cm^{-2}$, and a resistivity of $1\times10^7$ $\Omega$-cm or more. The wafer may have an optical absorption of less than 5 $cm^{-1}$ less than 4 $cm^{-1}$ or less than 3 $cm^{-1}$ at 940 nm wavelength. The wafer may have a carrier mobility of 3000 $cm^2$/V-sec or higher. The wafer may have a thickness of 500 μm or greater. Electronic devices may be formed on a first surface of the wafer. The wafer may have a carrier concentration of $1.1\times10^7$ $cm^{-3}$ or less.

20 Claims, 5 Drawing Sheets

LOW ETCH PIT DENSITY 6 INCH SEMI-INSULATING GALLIUM ARSENIDE WAFERS

CROSS-REFERENCE TO RELATED APPLICATIONS/INCORPORATION BY REFERENCE

This application is a continuation application of U.S. application Ser. No. 16/711,019 filed on Sep. 11, 2019, and claims priority to and the benefit of U.S. Provisional Application No. 62/779,039 filed on Dec. 13, 2018, both of which are hereby incorporated herein by reference in their entirety.

FIELD

Certain embodiments of the disclosure relate to semiconductor substrates. More specifically, certain embodiments of the disclosure relate to low etch pit density 6 inch semi-insulating gallium arsenide wafers.

BACKGROUND

Semiconductor substrates, and specifically Group III-V semiconductor substrates, are used in the manufacture of electronic and optoelectronic devices such as heterojunction bipolar transistors (HBTs), pseudo-morphic high-electron mobility transistors (pHEMTs), and lasers, for example. Defects in the substrates can reduce yields and increase costs.

Further limitations and disadvantages of conventional and traditional approaches will become apparent to one of skill in the art, through comparison of such systems with the present disclosure as set forth in the remainder of the present application with reference to the drawings.

BRIEF SUMMARY

A system and/or method for low etch pit density 6 inch semi-insulating gallium arsenide wafers, substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

DETAILED DESCRIPTION

Figure 1:
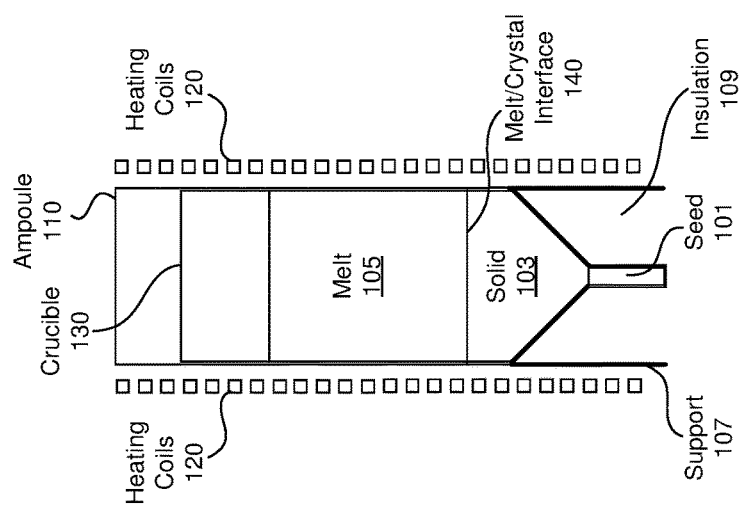
FIG. 1 is a diagram illustrating a vertical gradient freeze reactor, in accordance with an example embodiment of the disclosure.

Certain aspects of the disclosure may be found in low etch pit density 6 inch semi-insulating gallium arsenide wafers. FIG. 1 is a diagram illustrating a vertical gradient freeze reactor, in accordance with an example embodiment of the disclosure. Referring to FIG. 1, there is shown vertical gradient freeze (VGF) system 100 comprising an ampoule 110, a support 107, heating coils 120, and a crucible 130. Within the ampoule 110, growth may proceed using a seed crystal 101 and a liquid melt 105 in a vertical configuration, where the solid 103 forms due to very gradual cooling of the melt 105. The crucible 130 may comprise pyrolytic boron nitride (PBN), for example, and may contain the melt and seed materials during the process.

The VGF system 100 comprises a configuration for growth charge, heater, insulation and support that includes: direct radiation from heating coils 120 above the level of cone in the crystal growth charge, the seed 101, and may also comprise a support structure 107 for support of the ampoule 110 in the heating coils 120. In addition, insulation 109 may be placed within the support 107 to promote radial heat flux inward during growth and heat removal during post-growth process and cooling. The support cylinder 107 for the growth ampoule 110 may comprise a hollow core below the seed pocket holding the seed crystal 101 to provide a conducting heat flow path downward through the center and further aided and made more stable by a larger diameter quartz rod down to the bottom of the heater.

In the VGF process, a polycrystalline charge, the seed 101, in crucible 130 in the ampoule 110 may be heated with a multi-zone furnace, as represented by the heating coils 120. Crystal growth is initiated by melting the charge to the seed 101, thereby forming the melt 105, and slowly reducing the temperature to cool the melt 105 at the seed 101. The crystallization process, forming the solid 103, may be precisely controlled by varying the temperature grading in different zones of the furnace, such as by applying different currents to different portions of the heating coils 120. Accordingly, the heating coils 120 may comprise a multi-zone heating system where different temperatures, heating/cooling rates, and spatial temperature profiles are enabled.

The VGF process has several advantages over other processes such as liquid encapsulated Czochralski (LEC) and horizontal Bridgman (HB). First, the thermal environment of the crystal and melt are radially symmetric, enabling a radially uniform interface and precise control of temperature profiles. Second, growth in low axial and radial temperature gradients, combined with diameter control imposed by a crucible, and no need to use a large temperature gradient to freeze the crystal quickly, significantly reduces the strain and, hence, dislocations in the crystals. Third, the liquid-solid interface progresses upward through the melt, with crystallization starting at the seed 101 in the bottom of the crucible. The system is cooler at the bottom, and is thermally stabilized against convection. Even in the cooling process, easily adjustable cooling brings the crystal to room temperature at a rate that minimizes defects.

Semi-insulating GaAs crystals with an average dislocation density of 1000 $cm^{-2}$ or less in 6" or greater diameter wafers have not been manufactured previously. Current technologies typically demonstrate a dislocation density in the range of ~2000-5000/$cm^2$ in 6" semi-insulating GaAs grown by VGF/VB or other methods. These conventional methods report results in wafers that are smaller in diameter than disclosed here and may use co-dopants such as boron to reduce the dislocation density.

In an example embodiment of the present disclosure, a dislocation density of generally less than 1000/$cm^2$ and demonstrated less than 600 $cm^{-2}$ in 6 inch GaAs wafers as shown in by 69-point counts of etch pit density. The wafers demonstrated semi-insulating properties of >1×10$^7$ ohm-cm resistivity, 1×10$^6$-1×10$^7$ cm$^{-3}$ carrier concentration, and ~3×10$^3$ cm$^2$/V-sec or higher carrier mobility without addition of any co-dopants other than carbon used for obtaining the semi-insulating properties. In addition, this material has infrared absorption <2 cm$^{-1}$ at 1050 nm, and <4 cm$^{-1}$ at 940 nm. Dislocation density in undoped GaAs by the liquid encapsulated VGF process with proper encapsulation may be influenced more by thermal stress during growth and post-growth cooling in the larger size crystals of 6" in diameter or more. Larger diameters may be grown using a larger crucible, ampoule, and furnace.

Before crystal growth, the GaAs polycrystal is prefabricated by poly synthesis. The poly synthesis process may be performed in a quartz reactor tube utilizing a boat method. Once the polycrystalline GaAs is generated, VGF crystal growth may proceed. For the VGF process, a crystal growth charge may be prepared with the polycrystalline GaAs and an amount of B$_2$O$_3$ encapsulant just sufficient to cover the GaAs melt during growth. In addition, pure arsenic is included in the sealed ampoule 110 for stoichiometry control. The B$_2$O$_3$ encapsulant can result in an unintentional boron doping in the resulting ingot at a concentration in the 5×10$^{15}$ to 1×10$^{17}$ cm$^{-3}$, in contrast to intentional doping in the 1×10$^{18}$ and higher. In addition, carbon may be present in the 1×10$^{16}$ cm$^{-3}$ range which is compensated by the EL2 (gallium on arsenic site) defect, contributing to the semi-insulating property of the undoped GaAs.

Careful control of the VGF growth conditions enables low dislocation density in semi-insulating substrates with a 6 inch diameter or more. For example, control of growth gradients during the last stages of ingot growth and immediately following completion of growth may be important to low dislocation density. One stage involves reducing the gradients and the rate of change of gradients by controlling the temperature ramp rates for the different zones in the multi-zone furnace using the heating coils 120. A second stage involves applying the appropriate rate of cooling of the ingot from near growth temperatures to ~300 C below growth temperatures with the different zones in the furnace.

In an example embodiment of the disclosure, a VGF process may be utilized with axial gradients of 0.5 to 2.5 C/cm at the melt/crystal interface 140 and growth rates of 1-3 mm/h may be utilized while applying a controlled program of time and temperature for the different zones in the multi-zone furnace to maintain a ratio of 1.3 to 3.0 between the temperature gradient below the solid-liquid interface 140 to the temperature gradient above the interface during the entire growth process. This may enable an interface shape for single crystal growth and for a low level of stress in the just-solidifying ingot to obtain the low EPD.

In an example embodiment, a thermal profile adjustment and cooling process may be utilized with an axial gradient in the ingot after solidification at between 0.5 and 3.0 C/cm with a step-wise end-of-solidification thermal profile adjustment, followed by post-growth anneal. The cool down process may comprise a temperature change rate from completion of solidification to the end of a Step 1 ramp at 0.1 to 0.8 C/hour, making the ingot close to isothermal with axial gradients of between 0.5 and 1.0 C/cm. A Step 2 ramp may be utilized with 5-15 C/hour to 200 degrees C. below the end of solidification, with axial gradients of 0.5-1.0 C/cm. In addition, a Step 3 ramp of 30 C/hour may be utilized to cool to 600 C, and a further cooling of the ingot at 50 C/hour to room temperature may be used. The process for minimizing the radial temperature gradient and the variation in axial gradient through the length of the crystal may be utilized for minimizing stress in the grown crystal and obtaining low EPD in the large diameter crystals.

After completing the overall solidification, the temperature of the heating may be lowered to room temperature at a controlled rate. This process results in a low-dislocation 6 inch diameter GaAs single crystal with a cylindrical body portion. The dislocation density resulting from this process is shown in FIGS. 2A and 2B and electrical characterization results are shown in FIG. 2C.

Figure 2A:
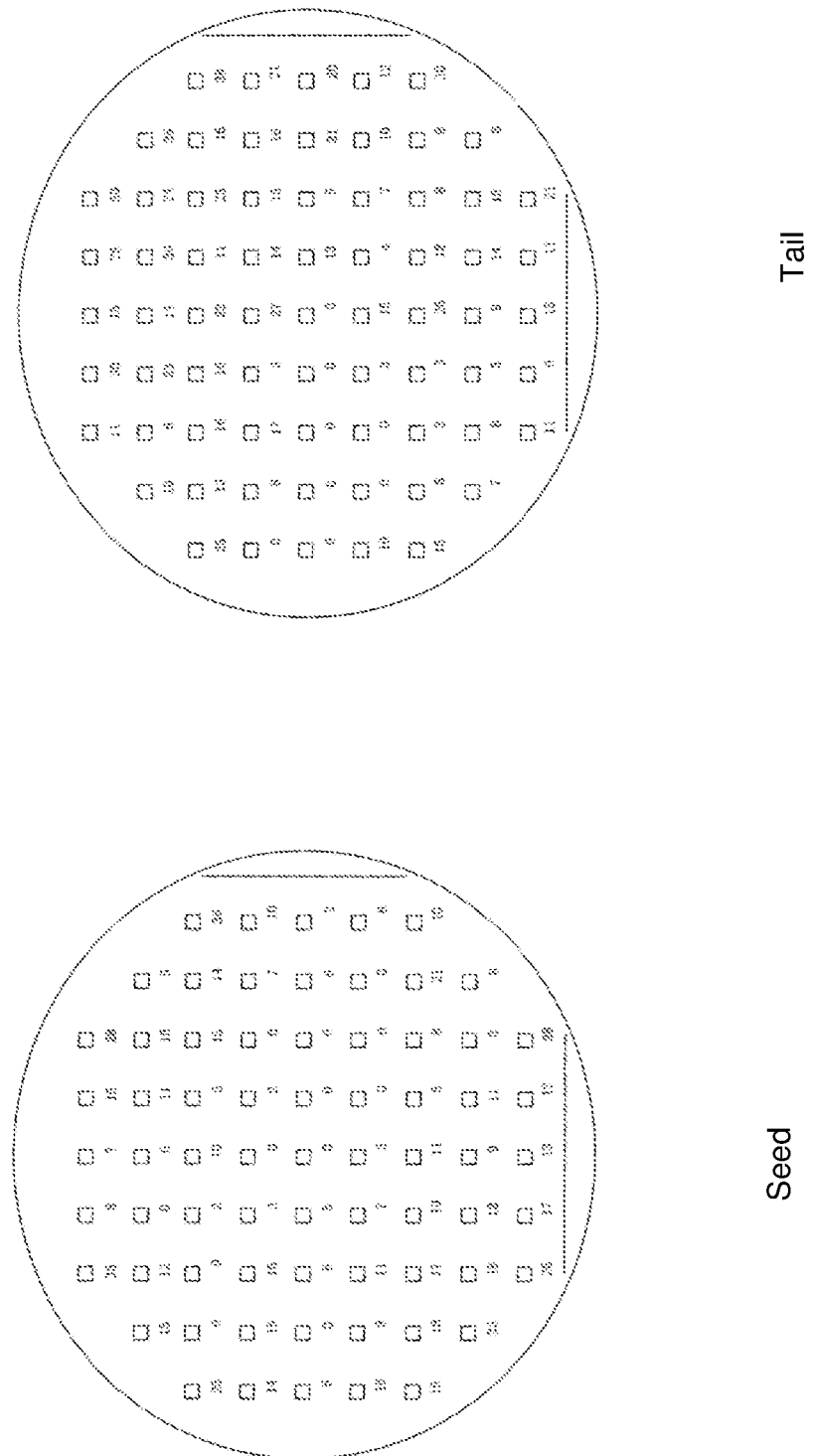
FIGS. 2A and 2B illustrates etch pit density results for 6" gallium arsenide wafers manufactured in accordance with an embodiment of the disclosure.
Figure 2B:
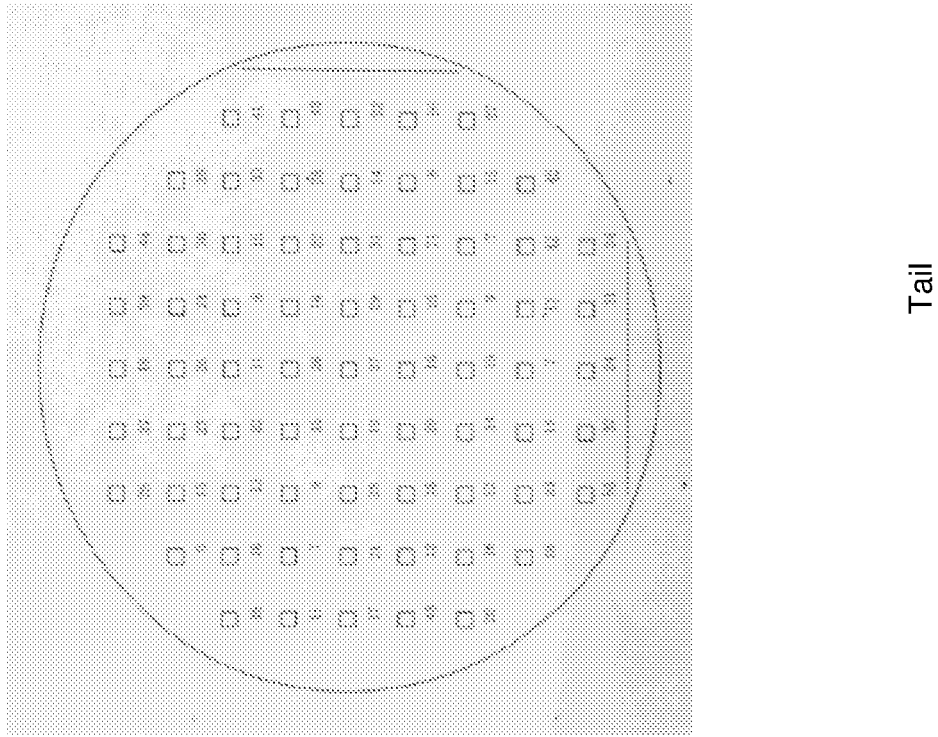
Figure 2B:
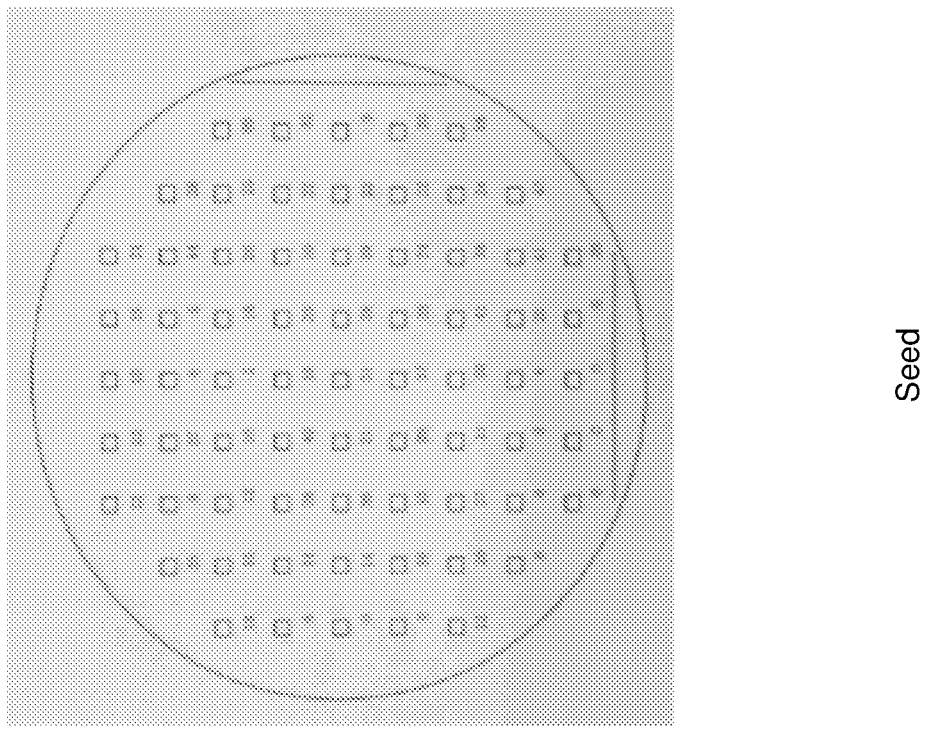

FIGS. 2A and 2B illustrates etch pit density results for 6 inch gallium arsenide wafers manufactured in accordance with an embodiment of the disclosure. Referring to FIG. 2A, there is shown EPD measurements for a wafer at the seed end of the ingot and at the tail end of the ingot. The EPD measurements are performed in accordance with SEMI M36-0699 and ASTM Test Method F140-92. An example of the EPD level as measured at 69 points (each point having an area of 0.024 cm$^2$) is shown in Table 1.

These examples show an average EPD of 427/cm$^2$ and a maximum EPD of 1500/cm$^2$ at the seed end and an average EPD 558/cm$^2$ with maximum EPD of 2083/cm$^2$ at the tail end. Therefore, the wafers described here demonstrate dislocation densities well under 1000 cm$^{-2}$, which is significantly improved over existing undoped GaAs substrates.

Referring to FIG. 2B, there is shown EPD measurements for a wafer at the seed end of the ingot and at the tail end of the ingot. Wafers fabricated using the process disclosed above may result in an average EPD of 200-900/cm$^2$ and a maximum EPD of 1200-2800/cm$^2$ at the seed end and an average EPD 600-930/cm$^2$ with maximum EPD of 2200-2400/cm$^2$ at the tail end, which is also significantly improved over existing undoped GaAs substrates.

The growth of very low EPD, semi-insulating GaAs wafers by the VGF process results in high device yield in highly integrated GaAs circuits. The VGF process described above yields very low EPD wafers of 6 inches in diameter or greater.

Table 1 below illustrates electrical characterization results for 6 inch diameter wafers from a gallium arsenide ingot, in accordance with an example embodiment of the disclosure.

TABLE 1

Electrical characterization results for end wafers from different ingots

| Sample | Carrier Concentration (cm$^{-3}$) | Mobility (cm$^2$/V-sec) | Resistivity (Ω-cm) |
|---|---|---|---|
| Ingot 1, head | 4.4 × 10$^6$ | 3470 | 4.1 × 10$^8$ |
| Ingot 1, tail | 1.1 × 10$^7$ | 2950 | 2.0 × 10$^8$ |
| Ingot 2, head | 4.4 × 10$^6$ | 4410 | 3.3 × 10$^8$ |
| Ingot 2, tail | 1.1 × 10$^7$ | 4750 | 1.3 × 10$^8$ |

Referring to Table 1, there are shown carrier concentrations, resistivity, and mobility measurements for end wafers from two ingots. At the head (seed) end, the carrier concentration is 4.4×10 6 cm$^{-3}$ for both ingots, with a carrier mobility of 3470-4410 Ω-cm, and resistivity of 3.3 to 4.1×10$^8$ ohm-cm. At the tail end of the ingot, the carrier concentration is 1.1×10$^7$ cm$^{-3}$, with a mobility of 2950-4750 Ω-cm, and resistivity of 1.3 to 2.0×10$^8$ ohm-cm. Therefore, the 6 inch GaAs substrates exhibited both low EPD and semi-insulating electrical properties of greater than 1×10$^7$ ohm-cm resistivity, less than 1×10$^7$ cm$^{-3}$ carrier concentration and mobility of 3000-4800 cm$^2$/V-sec, without co-dopants.

Optical absorption measurements may be utilized to determine the absorption coefficient for the grown wafers. Table 2 below illustrates absorption measurements on different wafers in two ingots.

TABLE 2

Optical absorption measurements for wafers from two ingots with a 940 nm laser as an optical source.

| Ingot/Wafer | Thickness (μm) | Absorption Coefficient (cm$^{-1}$) |
|---|---|---|
| 1, head | 720 | 3.16 |
| 1, tail | 720 | 2.89 |
| 2, head | 628 | 3.37 |
| 2, tail | 629 | 3.53 |

The optical data shows absorption coefficients less than 6 cm$^{-1}$, less than 4 cm$^{-1}$, and even less than 3 cm$^{-1}$. Furthermore, a Fourier transform infrared (FTIR) spectrometer measurement of absorption confirms these measurements with an absorption coefficient of 2.48 cm$^{-1}$ for a tail end wafer measured at 685 μm thickness of ingot 2 from Table 2.

Figure 3:
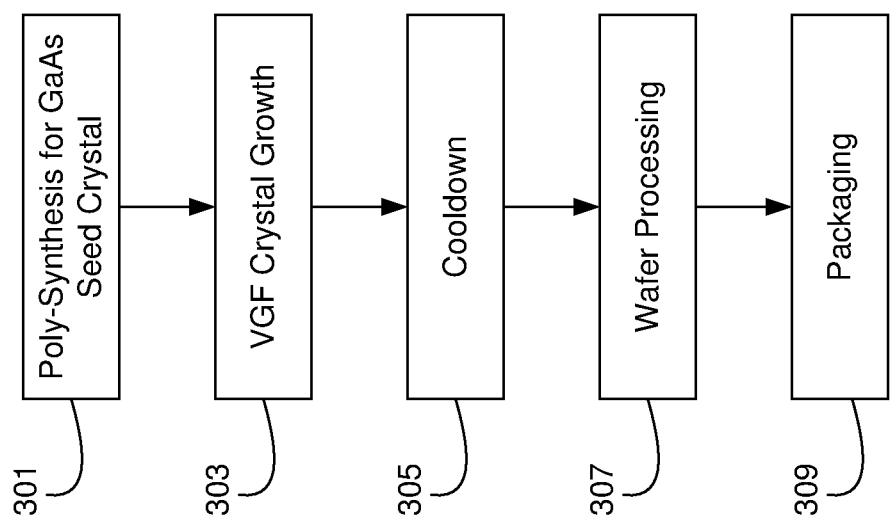
FIG. 3 illustrates a flow chart for fabricating gallium arsenide wafers using a vertical gradient freeze process, in accordance with an example embodiment of the disclosure.

FIG. 3 illustrates a method for fabricating GaAs wafers using the vertical gradient freeze furnace 100 shown in FIG. 1. This process results in 6 inch semi-insulating GaAs substrates with less than 1000 cm$^2$ etch pit density. This process may also be used to fabricate indium phosphide (InP), gallium phosphide (GaP) or other related III-V compound semiconductors.

In step 301, GaAs polycrystal is prefabricated by poly synthesis. The poly synthesis process may be performed in a quartz reactor tube utilizing a boat method. Once the polycrystalline GaAs is generated, vertical gradient freeze (VGF) crystal growth occurs in step 303 where the temporal and spatial temperature profiles are closely controlled to result in less than 1000 cm$^{-2}$ EPD on 6 inch or greater diameter crystals.

In an example embodiment of the disclosure, a VGF process may be utilized with axial gradients of 0.5 to 2.5 C/cm at the melt/crystal interface 140 and growth rates of 1-3 mm/h may be utilized while applying a controlled program of time and temperature for the different zones in the multi-zone furnace to maintain a ratio of 1.3 to 3.0 between the temperature gradient below the solid-liquid interface 140 to the temperature gradient above the interface during the entire growth process. This may enable an interface shape for single crystal growth and for a low level of stress in the just-solidifying ingot to obtain the low EPD.

In step 305, the ingot may be cooled in a controlled fashion to reduce dislocation formation. After completing the overall solidification, the temperature of the heating may be lowered to room temperature at the speed of about 1-2 degrees C./hour, 2-4 degrees C./hour, and 10-15 degrees C./hour, in different heating zones, respectively. This process results in a low-dislocation 6 inch diameter GaAs single crystal with a cylindrical body portion.

Once the VGF crystals are grown (and optionally tested), in step 307, the ingot may be processed to result in a rounded ingot with desired flats, for example, and may also be tested. Once the ingot is shaped, the ingot may be sliced into wafers, and the wafers may be tested for etch pit density and semi-insulating electrical characteristics. The wafer processing transitions the grown ingot into wafers using wafer processing steps of fine orienting, slicing, lapping, surface treatment, rough and finish polishing etc., to produce epi-ready wafers.

Once the low EPD wafers have been sliced from the ingot, the wafers may proceed to packaging step 309. The above processes may also be used to produce indium phosphide (InP) or other compound semiconductor wafers. As a result of this process, low EPD 6 inch GaAs wafers are produced.

In an embodiment of the disclosure, a method and wafers are disclosed for low etch pit density 6" semi-insulating gallium arsenide crystals without co-dopant, in that there are no intentional dopants other than carbon, for reducing the dislocation density. Without co-dopants, these semi-insulating substrates then have low infrared absorption, 2 cm$^{-1}$ or less at 1050 nm and 4 cm$^{-1}$ or less at 940 nm, for example, and can be used in optoelectronic applications where absorption is detrimental to device performance.

Figure 4:
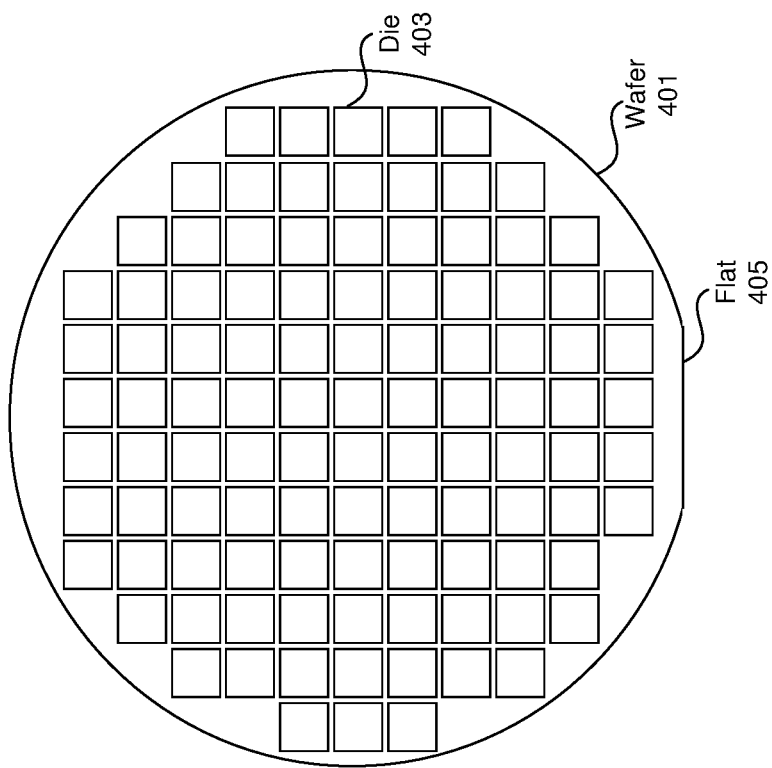
FIG. 4 illustrates devices fabricated on low etch pit density 6 inch semi-insulating gallium arsenide wafers, in accordance with an example embodiment of the disclosure.

FIG. 4 illustrates devices fabricated on low etch pit density 6 inch semi-insulating gallium arsenide wafers, in accordance with an example embodiment of the disclosure. Referring to FIG. 4, there is shown a 6 inch semi-insulating GaAs wafer 401 manufactured using the process described above, and further processed with electrical and/or optoelectronic devices on the die 403. There is also shown a flat 405, which may be formed in wafer fabrication to indicate a crystal plane, for example. The number of die 403 on the wafer 401 may be defined by the area of each die and the size shown in FIG. 4 is merely an example.

Semi-insulating GaAs substrates enable high-speed electronic devices due to the high resistivity of the substrates, where conductive substrates can cause losses and parasitic capacitance. Example devices include pseudomorphic high electron mobility transistors (pHEMTs) and heterojunction bipolar transistors. Dislocations in the substrate can reduce reliability of the devices as current can increase defect size, for example. In addition, the die 403 may comprise optoelectronic devices such as edge-emitting lasers, vertical cavity surface-emitting lasers (VCSELS), and photodetectors where it may be desired to communicate optical signals through the wafer 401. For example, an array of detectors or surface emitting lasers may be formed on the wafer 401 and readout or control circuitry may be placed on the devices while the optical signals are received and/or transmitted through the wafer 401. Low absorption of optical signals, such as the <2 cm$^{-1}$ at 1050 nm and <4 cm$^{-1}$ at 940 nm described here allow for such infrared applications.

In an embodiment of the disclosure, wafers for low etch pit density 6 inch semi-insulating gallium arsenide may include a semi-insulating gallium arsenide single crystal wafer having a diameter of 6 inches or greater without intentional dopants for reducing dislocation density, an etch pit density of less than 1000 cm$^{-2}$, and a resistivity of 1×10$^7$ Ω-cm or more. The wafer may have an optical absorption coefficient of less than cm$^{-1}$, less than 4 cm$^{-1}$, or less than 3 cm$^{-1}$ at 940 nm wavelength. The wafer may have a carrier mobility of 3000 cm$^2$/V-sec or higher. The wafer may have a thickness of 500 μm or greater. Electronic devices may be formed on a first surface of the wafer. The wafer may have a carrier concentration of 1.1×10$^7$ cm$^{-3}$ or less.

In another embodiment of the disclosure, a method for low etch pit density 6 inch semi-insulating gallium arsenide wafers may include sealing charge material comprising polycrystalline gallium arsenide, a gallium arsenide seed crystal, B$_2$O$_3$ encapsulant, and carbon in a crucible; sealing the crucible in a quartz ampoule; performing a vertical gradient freeze crystal growth process by heating the ampoule using a multi-zone heating system to progressively melt the charge material until a portion of the seed crystal is melted; starting growth from the partially melted seed by implementing a controlled cooling of the multi-zone heating system at a rate of 0.1 to 2 degree C./hour or more specifically 0.2 to 0.5 degree C./hour; applying a temperature gradient of between 0.2 to 5 C/cm or more specifically 0.5 to 2.5 C/cm at a melt-crystal interface; and maintaining a ratio of 1.0 to 4.0 or more specifically 1.3 to 3.0 between a temperature gradient above the melt-crystal interface to a temperature gradient below the melt-crystal interface in the multi-zone heating system to form a solidified gallium arsenide crystal.

The cooling of the multi-zone heating system may be controlled at the rate of 0.1 to 2 C/hour or more specifically 0.1-0.8 C/hour to make a uniform temperature with axial gradients of 0.5 to 1.0 degree C./cm. The solidified gallium arsenide crystal may be further cooled by 300 C at a ramp rate of 5 to 15 degrees C./hour. The solidified gallium arsenide crystal may be further cooled to room temperature at a ramp rate of 20-40 degrees C./hour. The solidified crystal may have a diameter of 6 inches or more. The crucible may be evacuated before sealing it into the quartz ampoule.

While the invention has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:

1. A method for forming single crystal gallium arsenide substrates, the method comprising:
    sealing charge material comprising polycrystalline gallium arsenide, a gallium arsenide seed crystal, $B_2O_3$ encapsulant, and carbon in a crucible;
    sealing the crucible in a quartz ampoule;
    performing a vertical gradient freeze crystal growth process by heating the ampoule using a multi-zone heating system to progressively melt the charge material until a portion of the seed crystal is melted;
    starting growth from the partially melted seed by implementing a controlled cooling of the multi-zone heating system at a rate of 0.1 to 2 degree C./hour;
    applying a temperature gradient of between 0.2 to 5 C/cm at a melt-crystal interface; and
    maintaining a ratio of 1.0 to 4 between a temperature gradient above the melt-crystal interface to a temperature gradient below the melt-crystal interface in the multi-zone heating system to form a solidified gallium arsenide crystal.

2. The method according to claim 1, comprising controlling the cooling of the multi-zone heating system at a rate of 0.1-2 C/hour to make a uniform temperature with axial gradients of 0.2 to 2 degree C./cm.

3. The method according to claim 2, comprising further cooling the solidified gallium arsenide crystal by 300 C at a ramp rate of 5 to 15 degrees C./hour.

4. The method according to claim 3, comprising further cooling the solidified gallium arsenide crystal to room temperature at a ramp rate of 20-40 degrees C./hour.

5. The method according to claim, 1, comprising evacuating the crucible before sealing it into the quartz ampoule.

6. The method according to claim 1, wherein the solidified gallium arsenide crystal has a diameter of 6 inches or more.

7. The method according to claim 1, comprising further forming a wafer from the solidified gallium arsenide crystal.

8. The method according to claim 7, wherein the wafer has an optical absorption of 6 $cm^{-1}$ or less at 940 nm wavelength.

9. The method according to claim 7, wherein the wafer has an optical absorption of 4 $cm^{-1}$ or less at 940 nm wavelength.

10. The method according to claim 7, wherein the wafer has an optical absorption of 3 $cm^{-1}$ or less at 940 nm wavelength.

11. The method according to claim 7, wherein the wafer has a carrier mobility of 3000 $cm^2$/V-sec or higher.

12. The method according to claim 7, wherein the wafer has a thickness of 300 μm or greater.

13. The method according to claim 7, wherein electronic and/or optoelectronic devices are formed on a first surface of the wafer.

14. The method according to claim 7, wherein the wafer has a carrier concentration of $1.1 \times 10^7$ $cm^{-3}$ or less.

15. A method for forming single crystal gallium arsenide substrates, the method comprising:
    sealing charge material comprising polycrystalline gallium arsenide, a gallium arsenide seed crystal, $B_2O_3$ encapsulant, and carbon in a crucible;
    sealing the crucible in a quartz ampoule;
    performing a vertical gradient freeze crystal growth process by heating the ampoule using a multi-zone heating system to melt the charge material until a portion of the seed crystal is melted;
    starting growth from the partially melted seed by implementing a controlled cooling of the multi-zone heating system at a rate of 1 to 2 degrees C./hour;
    applying a temperature gradient of between 0.5 to 2.5 C/cm at a melt-crystal interface; and
    forming a solidified gallium arsenide crystal with a diameter of 6 inches or more.

16. The method according to claim 15, comprising further shaping the solidified gallium arsenide crystal as a rounded ingot.

17. The method according to claim 15, comprising further Slicing the rounded ingot into wafers.

18. The method according to claim 15, comprising further maintaining a ratio of 1.0 to 4 between a temperature gradient above the melt-crystal interface to a temperature gradient below the melt-crystal interface in the multi-zone heating system to form the solidified gallium arsenide crystal.

19. The method according to claim 15, comprising further cooling the solidified gallium arsenide crystal by 300 C at a ramp rate of 5 to 15 degrees C./hour.

20. The method according to claim 15, comprising further evacuating the crucible before sealing it into the quartz ampoule.

* * * * *